United States Patent
Stirk

(10) Patent No.: US 9,413,359 B2
(45) Date of Patent: Aug. 9, 2016

(54) METHOD FOR CLOCK CALIBRATION

(71) Applicant: Apple Inc., Cupertino, CA (US)

(72) Inventor: Gary L. Stirk, West Melbourne, FL (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/743,174

(22) Filed: Jun. 18, 2015

(65) Prior Publication Data

US 2016/0182058 A1 Jun. 23, 2016

Related U.S. Application Data

(60) Provisional application No. 62/096,323, filed on Dec. 23, 2014.

(51) Int. Cl.
*H03K 5/135* (2006.01)
*H03L 7/00* (2006.01)

(52) U.S. Cl.
CPC .......................................... *H03L 7/00* (2013.01)

(58) Field of Classification Search
USPC .......... 327/141, 144–145, 291, 293, 295–298
See application file for complete search history.

(56) References Cited

U.S. PATENT DOCUMENTS

| | | | |
|---|---|---|---|
| 6,661,735 B2 | 12/2003 | Lee | |
| 6,859,079 B2 * | 2/2005 | Haraguchi | G06F 1/08 327/156 |
| 7,149,127 B2 | 12/2006 | Kikuchi | |
| 7,810,003 B2 | 10/2010 | Seong | |
| 8,531,216 B1 * | 9/2013 | Wu | H03J 7/04 327/144 |
| 2008/0091362 A1 | 4/2008 | Tae | |
| 2014/0125274 A1 | 5/2014 | Kim | |

FOREIGN PATENT DOCUMENTS

| | | |
|---|---|---|
| DE | 102013100799 | 6/2014 |
| EP | 2485293 | 8/2012 |

OTHER PUBLICATIONS

Pape; "Application Note AN2312/D Jul. 2002 MC68HC908QY4 Internal Oscillator Usage Notes"; Freescale Semiconductor, Inc.; 2004.
International Search Report and Written Opinion in application No. PCT/US2015/055405 issued Jan. 28, 2016.

* cited by examiner

*Primary Examiner* — An Luu
(74) *Attorney, Agent, or Firm* — Meyertons, Hood, Kivlin, Kowert & Goetzel, P.C.

(57) ABSTRACT

A system may include a plurality of devices, wherein each device of the plurality of devices has a respective clock source. A first device of the plurality of devices may be configured to generate a first clock signal. A second device of the plurality of devices may be configured to generate a second clock signal, receive the first clock signal from the first device, and modify a first frequency of the first clock signal. The second device may be further configured to adjust a second frequency of the second clock signal dependent upon the modified first frequency of the first clock signal.

20 Claims, 7 Drawing Sheets

METHOD FOR CLOCK CALIBRATION

PRIORITY CLAIM

The present application claims benefit of priority to U.S. Provisional Application No. 62/096,323, filed on Dec. 23, 2014, which is hereby incorporated by reference in its entirety as though fully and completely set forth herein. In the event any statements seemingly conflict, then the statements disclosed in the present application supersede the conflicting statements disclosed in U.S. Provisional Application No. 62/096,323.

BACKGROUND

1. Technical Field

Embodiments described herein are related to the field of integrated circuits, and more particularly to calibrating clock signals between integrated circuits.

2. Description of the Related Art

Computing systems may include one or more systems-on-a-chip (SoCs), which may integrate a number of different functions, such as, application execution, graphics processing and audio processing, onto a single integrated circuit (IC). With numerous functions included in a single IC, chip count may be kept low in mobile computing systems, such as tablets, for example, which may result in reduced assembly costs, and a smaller form factor for such mobile computing systems.

Various computing systems may include multiple SoCs or other types of ICs. Some of these computing systems may include ICs in more than one voltage domain, i.e., different ICs powered by different power supplies which may have different power supply voltage levels and/or different common mode voltage levels (also commonly referred to as "ground reference," "voltage grounds," or simply "grounds"). In some systems, a clock signal in an SoC in one voltage domain may be calibrated to a different clock signal in an IC in another voltage domain. Distributing a single clock signal across multiple voltage domains may result in level shifting circuits being used to cross voltage domains, which may introduce delay and complexity into the design.

SUMMARY OF THE EMBODIMENTS

Various embodiments of a communication circuit are disclosed. Broadly speaking, a system, an apparatus, and a method are contemplated in which the system may include a plurality of devices, wherein each device of the plurality of devices has a respective clock source. A first device of the plurality of devices may be configured to generate a first clock signal. A second device of the plurality of devices may be configured to generate a second clock signal, receive the first clock signal from the first device, and modify a first frequency of the first clock signal. The second device may be further configured to adjust a second frequency of the second clock signal dependent upon the modified first frequency of the first clock signal.

In a further embodiment, the first device may be further configured to use a clock output of an inter-integrated circuit (I2C) interface to generate the first clock signal. In another embodiment, to modify the first frequency of the first clock signal, the second device may be further configured to stretch the first clock signal.

In one embodiment, the second device may be further configured to generate a third clock signal with the first frequency and send the third clock signal to a third device of the plurality of devices. In a further embodiment, the third device may be configured to generate a fourth clock signal, receive the third clock signal from the second device, and modify the first frequency of the third clock signal. The third device may also be configured to adjust a fourth frequency of the fourth clock signal dependent upon the modified first frequency of the third clock signal.

In another embodiment, to generate the first clock signal, the first device may include a crystal oscillator. In an embodiment, a respective supply voltage terminal of the first device may be coupled to a positive terminal of a first power supply, and a respective common mode voltage terminal of the second device may be coupled to the positive terminal of the first power supply.

BRIEF DESCRIPTION OF THE DRAWINGS

The following detailed description makes reference to the accompanying drawings, which are now briefly described.

Figure 1:
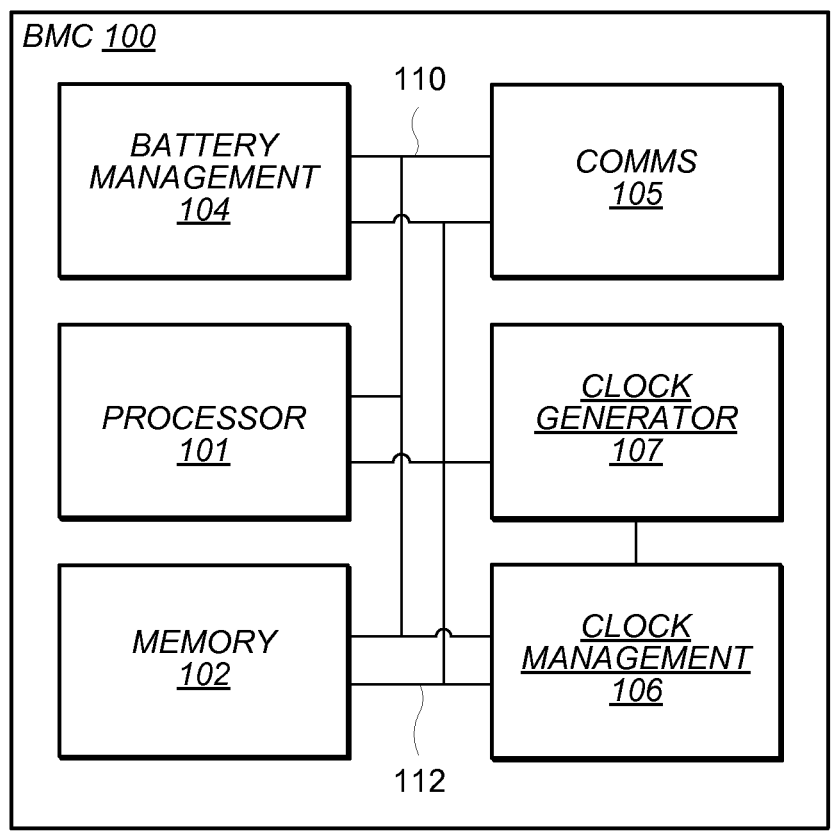
FIG. 1 illustrates an embodiment of a block diagram of a battery management circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Portable devices may utilize one or more battery cells for providing power to the circuits of the device. Each battery cell includes a positive and negative terminal capable of providing voltage and current to one or more of the circuits. In some devices, battery management circuits may be used to monitor and manage the performance of the battery cells. Some such devices may use a single management circuit to manage the battery cells while other devices may use one management circuit for each battery cell. In cases in which multiple battery management circuits are used, each circuit may receive power only from the battery cell it is monitoring. Providing a dedicated management circuit to each battery cell may provide advantages such as allowing the circuit to be placed adjacent to or even within a package of the cell. A dedicated management circuit could, however, make clock calibration between the management circuits problematic since the battery cells may have different voltage levels at any given time. In addition, battery cells arranged in series will result in each coupled management circuit having a different common mode voltage level than the other management circuits. Such issues might require additional circuits for level shifting clock signals between two or more battery management circuits.

A clock calibration methodology is disclosed herein which may allow clock signals in respective voltage domains to be calibrated to a single clock signal. The disclosed embodiments include a method for clock calibration using a standard communication interface.

It is noted that, although battery management circuits are used herein to demonstrate the disclosed concepts, these concepts may apply to other types of circuits as well. For example, the concepts may apply to circuits such as a processor and a memory, a sensor and a control unit, an input device and a computing system, or any two or more circuits requiring a communications channel.

Many terms commonly used in reference to IC designs are used in this disclosure. For the sake of clarity, the intended definitions of some of these terms, unless stated otherwise, are as follows.

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an re-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

It is also noted that, as used herein, the term "common mode voltage" refers to voltage applied to a ground node or terminal of a given circuit. "Common mode voltage" may also be referred to as "ground reference," "voltage ground," or simply "ground" in respect to the given circuit. Two circuits with different common mode voltages may include additional circuitry, such as level shifting circuits, in order to share a typical voltage driven signal.

The embodiments illustrated and described herein may employ CMOS circuits. In various other embodiments, however, other suitable technologies may be employed.

A block diagram of an embodiment of a battery management circuit is shown in FIG. 1. In the illustrated embodiment, BMC 100 includes processor 101 coupled to memory block 102, battery management unit 104, communication block 105, clock management unit 106, all coupled through bus 110. Additionally, clock generator 107 may be coupled to clock management unit 106 and provide one or more clock signals 112 to the functional blocks in BMC 100.

Processor 101 may, in various embodiments, be representative of a general-purpose processor that performs computational operations. For example, processor 101 may be a central processing unit (CPU) such as an embedded processor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., ARM Cortex, PowerPC™, or x86 ISAs, or combination thereof. Processor 101 may include one or more bus transceiver units that allow processor 101 to communicate to other functional blocks via bus 110, such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM). Some embodiments may include a single memory, such as memory block 102 and other embodiments may include more than two memory blocks (not shown). In various embodiments, memory block 102 may be configured to store program instructions that may be executed by processor 101, store data to be processed, such as graphics data, or a combination thereof.

Battery management unit 104 includes circuits to manage the performance of a battery coupled to BMC 100. Battery management unit 104 may include one or more analog-to-digital converters (ADCs) for measuring voltage levels of sensors, such as, e.g., sensor element 103 in FIG. 1. Battery management unit 104 may include additional circuits for measuring temperature, measuring charge/coulombs, and controlling charging of the coupled battery.

Communication block 105 includes circuits for communicating with other ICs. Communication block may include circuits for supporting multiple communication protocols, such as, for example, inter-integrated circuit (I²C), universal asynchronous receiver/transmitter (UART), and serial peripheral interface (SPI). In addition, communication block 105 includes support for a communication protocol that enables signals to be transmitted and received across two or more voltage domains. The additional protocol may provide communication support between two or more BMCs, each coupled to and powered by separate batteries.

Clock management unit 106 may be configured to enable, configure and monitor outputs of one or more clock sources. In various embodiments, the clock sources may be located in clock generator 107, communication block 105, within clock management unit 106, in other blocks within BMC 100, or come from an external signal coupled through one or more input/output (I/O) pins. In some embodiments, clock management 106 may be capable of configuring a selected clock source before it is distributed throughout BMC 100. Clock management unit 106 may include circuits for calibrating an internal clock source to an external clock signal.

Clock generator 107 may be a separate module within BMC 100 or may be a sub-module of clock management unit 106. One or more clock sources may be included in clock generator 107. In some embodiments, clock generator 107 may include PLLs, FLLs, DLLs, internal oscillators, oscillator circuits for external crystals, etc. One or more clock signal outputs 112 may provide clock signals to various functional blocks of BMC 100.

System bus 110 may be configured as one or more buses to couple processor 101 to the other functional blocks within the BMC 100 such as, e.g., memory block 102, and I/O block 103. In some embodiments, system bus 110 may include interfaces coupled to one or more of the functional blocks that allow a particular functional block to communicate through the bus. In some embodiments, system bus 110 may allow movement of data and transactions (i.e., requests and responses) between functional blocks without intervention from processor 101. For example, data received through the I/O block 103 may be stored directly to memory block 102.

It is noted that the BMC illustrated in FIG. 1 is merely an example. In other embodiments, different functional blocks and different configurations of functions blocks may be possible dependent upon the specific application for which the BMC is intended.

Figure 2:
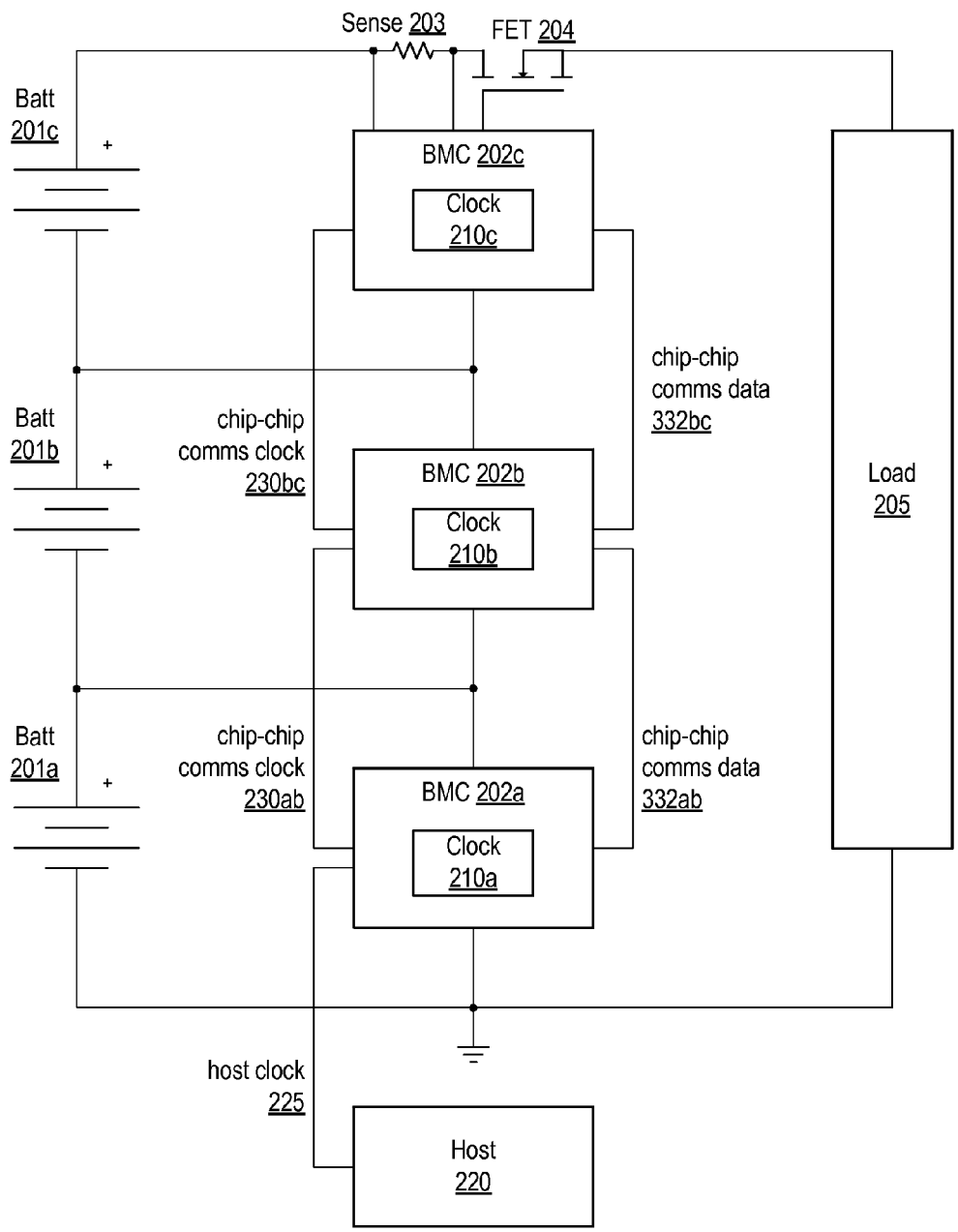
FIG. 2 shows an embodiment of a battery management system with multiple battery cells.

Turning to FIG. 2, an embodiment of a block diagram of a battery management system with multiple battery cells is illustrated. The illustrated embodiment of system 200 includes batteries 201a-c, battery management circuits (BMCs) 202a-c, sensor element (sense) 203, field-effect transistors (FET) 204, load 205, and host 220. Each BMC 202 includes a corresponding clock circuit 210. System 200 also includes signals host clock 225, host data 227, chip-to-chip communications (comms) clocks 230ab and 230bc, and chip-to-chip communications (comms) data 235ab and 235bc. System 200 may correspond to a portion of a portable computing system, such as a laptop computer, smartphone, tablet or wearable device.

Batteries 201a-c provide power to circuits included in load 205. In the present embodiment, batteries 201a-c are rechargeable, while they may be disposable in other embodiments. Batteries 201a-c are arranged in series and battery 201a may be referred to herein as the "bottom cell," battery 201b referred to as the "middle cell," and battery 201c referred to as the "top cell." In some embodiments, each cell may provide power directly to at least a portion of load 205, while in other embodiments, such as illustrated, power to load 205 may be provided to load 205 via all batteries 201a-c in series. Load 205 represents any circuit receiving power from batteries 201a-c and may correspond to any number of circuits and devices used in a portable computing system.

BMCs 202a-c manage the performance of each corresponding battery 201a-c. In other words, BMC 202a manages battery 201a, BMC 202b manages battery 201b, and BMC 202c manages battery 201c. Each BMC 202a-c receives power from the respective battery 201a-c that the BMC is monitoring. Since batteries 201a-c are arranged in series, each BMC 202a-c may be operating with a different supply voltage level as well as a different common mode voltage level. For example, the common mode voltage level for BMC 202b is the same as the supply voltage level for BMC 202a. Likewise, the supply voltage level for BMC 202b is the same as the common mode voltage level of BMC 202c.

BMCs 202a-c manage the performance of their respective battery by measuring and tracking current and/or charge supplied by batteries 201a-c to load 205. Each BMC 202a-c may also measure and track a recharging current into batteries 201a-c. BMC 202c measures current/charge using sensor element 203. Sensor element 203 may be a resistor, inductor, or other component or circuit capable of sensing a direction and magnitude of current.

BMC 202c turns FET 204 on and off, using FET 204 as a power switch to allow current to pass from batteries 201a-c to load 205. Current from batteries 201a-c may flow through the sensor element 203 whenever FET 204 is turned on, either for supplying power from, or charging batteries 201a-c. Although FET 204 is illustrated and described as a field effect transistor, in other embodiments, any other suitable type of transistor may be used and, in some embodiments, FET 204 may correspond to multiple transistors.

Load 205 represents any circuit or circuits receiving power from batteries 201a-c. In various embodiments, load 205 may be a single IC, a complete portable computing device, or a portion of a computing device. Load 205, may, in embodiments in which batteries 201a-c are rechargeable, include circuits for relaying a recharging current to the batteries.

Each BMC 202a-c maintains information on the operation of the respective battery 201a-c, such as, for example, average and peak supply currents, average and peak recharging currents, current charge level, current voltage level, a number of recharging cycles, a time since the last charging cycle, or any other relevant information on the respective battery 201a-c. BMCs 202a-c may share some or all information with host 220. Host 220 may be a main processor in the computing system, or a part of a system management unit used to monitor and control hardware in the computing system. Host 220 may also be a part of load 205, i.e., may be powered by one or more of batteries 201a-c. In the illustrated embodiment, host 220 is coupled to communicate with the BMC monitoring the bottom cell, i.e., BMC 202a. BMC 202a is coupled to communicate with BMC 202b via chip-to-chip communications (comms) data 235ab and BMC 202b is subsequently coupled to communicate with BMC 202c via chip-to-chip communications (comms) data 235bc. These serialized connections allow host 220 to communicate with each of BMCs 202a-c.

In some embodiments, to manage each of the batteries 201a-c, each BMC 202a-c may use calibrated clock signals, allowing measurements to be made at coordinated times and over similar periods of time. To calibrate timing amongst each BMC 202a-c and host 220, each BMC 202a-c includes a respective clock calibration circuit 210. Since each BMC 202a-c is operating with a different supply voltage level and common mode voltage level, as previously described, clock signals within each BMC 202a-c may be calibrated to each other rather than using a single clock signal coupled to all BMCs 202a-c. A calibration operation may be performed by some or all BMCs 202a-c periodically to calibrate each of their respective local clock sources in clock circuits 210a-c to a single system clock signal, such as host clock 225, for example. The time frame for the periodic calibration may depend upon a design of the local clock sources and/or various operating conditions, such as temperature or voltage levels of batteries 201a-c. For example, one clock source design may have a high level of long term accuracy, and therefore, be able to run for longer time periods without requiring calibration with host clock 225. Other clock source designs may have lower levels of long term accuracy and require more frequent calibration operations to maintain suitable clock signal accuracy.

To communicate with host 220, the communication block of BMC 202a uses a standard communication protocol such as $I^2C$, SPI, or UART. Since BMC 202a is powered from the bottom cell, host 220 and BMC 202a may share a single common mode voltage level, although each may still have a different supply voltage level. Even in an embodiment with different supply voltage levels, BMC 202a and host 220 may communicate via a standard communication protocol (such as $I^2C$, for example) using open-drain signals without level shifting circuits. In some embodiments, host clock 225 may correspond to a clock signal of an $I^2C$, commonly referred to as a serial clock line (SCL).

In some embodiments, BMC 202a may use this SCL signal from host 220 for a clock calibration operation. For example, host 220 may send a calibration command to BMC 202a through an $I^2C$ interface, causing BMC 202a to enter into a calibration operation. In other embodiments, calibration operations may be included as part of other commands. Host 220 may, for example, send a broadcast command to all BMCs 202 and the calibration operation may be initiated for all BMCs 202. In various embodiments, a calibration operation may be performed in parallel, among multiple BMCs 202, or BMC 202a may calibrate with host clock 225 first and then send chip-to-chip communications (comms) clock 230ab to BMCs 202b which then sends chip-to-chip communications (comms) clock 230bc to BMC 202c. BMC 202b and BMC 202c may then be calibrated in parallel. Further details on clock calibration will be provided below.

It is noted that the block diagram of FIG. 2 is merely an example for demonstrating the disclosed concepts. Any suitable number of batteries may be included with a corresponding number of battery management circuits. In other embodiments, each battery 201 may include more than one battery cell in any suitable arrangement.

Figure 3:
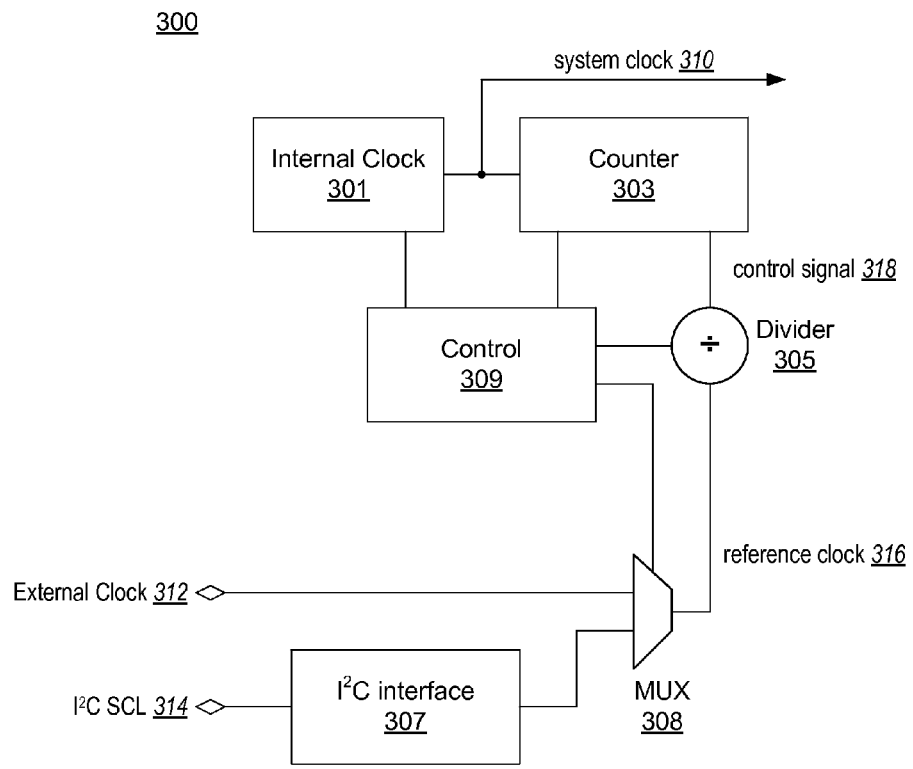
FIG. 3 shows a block diagram of an embodiment of a clock calibration circuit.

Moving now to FIG. 3, a block diagram of an embodiment of a clock calibration circuit is illustrated. Clock calibration circuit 300 may correspond to each of clock calibration circuits 210a-c in FIG. 2 and, therefore, be a subsystem of a battery management circuit such as each of BMC 202a-c. Clock calibration circuit 300 includes internal clock generator 301 coupled to counter circuit 303 and control logic 309. Control logic 309 is coupled to frequency divider 305, and to multiplexor circuit (MUX) 308 which is coupled to $I^2C$ interface 307. Signals external clock 312 and $I^2C$ SCL 314 are received by clock calibration circuit 300 and system clock 310 is an output.

Internal clock generator 301 may include any suitable type of clock circuit capable of producing a periodic clock signal. For example, internal clock generator 301 may correspond to a feedback oscillator or a relaxation oscillator. In the illustrated embodiment, internal clock generator 301 has an adjustable frequency dependent upon a current setting. Upon powering on, the frequency may oscillate at a predetermined value dependent on a default setting. System clock 310 is the output of internal clock generator 301 and is provided as an input to counter circuit 303 as well as to other circuits in the BMC.

Counter circuit 303 receives system clock 310 and increments a count value for each rising transition (or falling transition) of system clock 310. Counter circuit 303 also receives control signal 318 from frequency divider 305 to establish a time period for counter circuit 303 to increment the count value, e.g., one period of control signal establishes a counting cycle. For example, counter circuit 303 may start counting rising transitions of system clock 310 at a falling transition of the output of frequency divider 305 and stop incrementing at a rising transition, or vice versa. In other embodiments, a counting cycle may begin and end at each rising or falling transition of control signal 318.

It is noted that a "clock transition," as used herein (which may also be referred to as a "clock edge") refers to a clock signal changing from a first logic value to a second logic value. A clock transition may be "rising" if the clock signal goes from a low value to a high value, and "falling" if the clock signal goes from a high to a low.

The input signal to frequency divider 305 is reference clock 316 and is selected dependent upon a setting of MUX 308. In the present embodiment, MUX 308 receives as inputs, external clock 312, and $I^2C$ SCL 314 via $I^2C$ interface 307. Referring back to FIG. 2, for BMC 202a, external clock 312, and/or $I^2C$ SCL 314 may correspond to host clock 225 from host 220. In reference to BMC 202b, external clock 312 may correspond to chip-to-chip comms clock 230ab from BMC 202a and likewise, for BMC 202c, external clock 312 may correspond to chip-to-chip comms clock 230bc from BMC 202a. In regards to BMC 202b and BMC 202c, the $I^2C$ interface is not used and therefore $I^2C$ SCL 314 is not available as reference clock 316.

The selected reference clock 316 is provided to frequency divider 305. The frequency of reference clock 316 is divided to an appropriate value that is lower than a frequency of system clock 310, producing control signal 318. The selection of reference clock 316 and the selection of the divisor in frequency divider 305 is performed by control logic 309. In other embodiments, the divisor of frequency divider 305 may be a fixed value rather than selected by control logic 309. Control logic 309 selects reference clock 316 and the divisor value of divider 305 dependent upon a target frequency for system clock 310. In some embodiments, the target frequency may be a fixed value, while in other embodiments, a processor, such as, for example, processor 101 in FIG. 1, may determine the target frequency and may set control logic 309 accordingly. Once the divisor of frequency divider 305 and reference clock 316 are selected, control logic 309 reads the counter value of counter circuit 303 at the end of a counting cycle determined by control signal 318. For a given target frequency and the selected reference clock 316 and settings of divider 305, control logic 309 expects a certain count value if system clock 310 is at the target frequency. If system clock 310 has a higher frequency, then the count value will be higher than the expected count value. In response, control logic adjust an input to internal clock generator 301 to reduce the frequency of system clock 310. Conversely, if the read count value is below the expected count value, then control logic 309 adjust internal clock generator 301 to increase the frequency of system clock 310. The process repeats, continuing the counting cycles until the read count value matches the expected count value (or, in some embodiments, is within a predetermined range of the expected count value).

It is noted that clock calibration circuit 300 of FIG. 3 merely illustrates an example embodiment of a clock calibration circuit. Only the components necessary to demonstrate the disclosed concepts are shown. In other embodiments, additional components may be included. For example, the illustrated embodiment shows only two clock sources as inputs to MUX 308, whereas, any suitable number of clock sources may be used as a reference clock.

Figure 4:
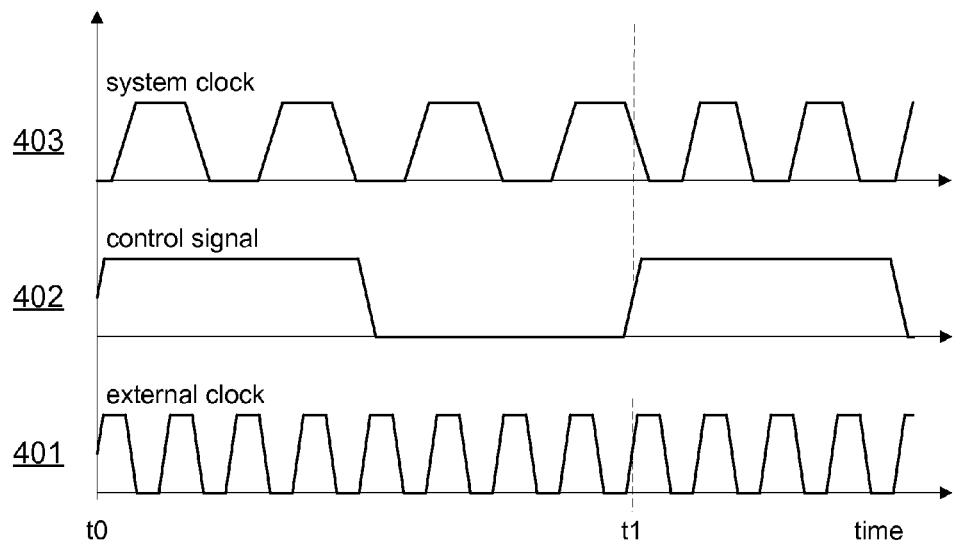
FIG. 4 illustrates a timing diagram for an embodiment of a clock calibration system.

Turning now to FIG. 4, a timing diagram for an embodiment of a clock calibration system is shown. Timing diagram 400 illustrates several waveforms associated with an embodiment of a clock calibration system, such as, for example, clock calibration circuit 300 in FIG. 3. Timing diagram 400 includes waveforms showing logic states versus time for three signals from FIG. 3. Waveform 401 corresponds to external clock 312, waveform 402 corresponds to control signal 318, and waveform 403 corresponds to system clock 310.

In the present embodiment, a counting cycle of counter circuit 303 corresponds to a rising transition on control signal 402 to the next rising transition, e.g., from time t0 to time t1. Control signal 402 is the output of frequency divider 305 and in this example corresponds to external clock 401 divided by eight.

At time t0, system clock 403 is running below a target frequency. Counter circuit 303 begins a counting cycle at a rising transition of control signal 402. Each rising transition of system clock 403 causes counter circuit 303 to increment the count value. At time t1, another rising transition occurs on control signal 402, ending the current counting cycle with a count of four. Control logic 309 reads this count value and determines that the value of four is below the expected count value. In response, control logic 309 adjust internal clock generator 301 to increase the frequency of system clock 403 as can be seen after time t1.

It is noted that timing diagram 400 of FIG. 4 is merely an example of possible waveforms in a clock calibration circuit. The signals in FIG. 4 are simplified to provide clear descriptions of the disclosed concepts. In various embodiments, the signals may appear different due various influences such as technology choices for building the circuits, actual circuit design and layout, ambient noise in the environment, choice of power supplies, etc. In addition, the relative frequencies of the three illustrated signals were chosen for ease of comprehension. In various embodiments, the frequencies of the system clock and/or the external clock may be much greater than the frequency of the control signal.

Figure 5:
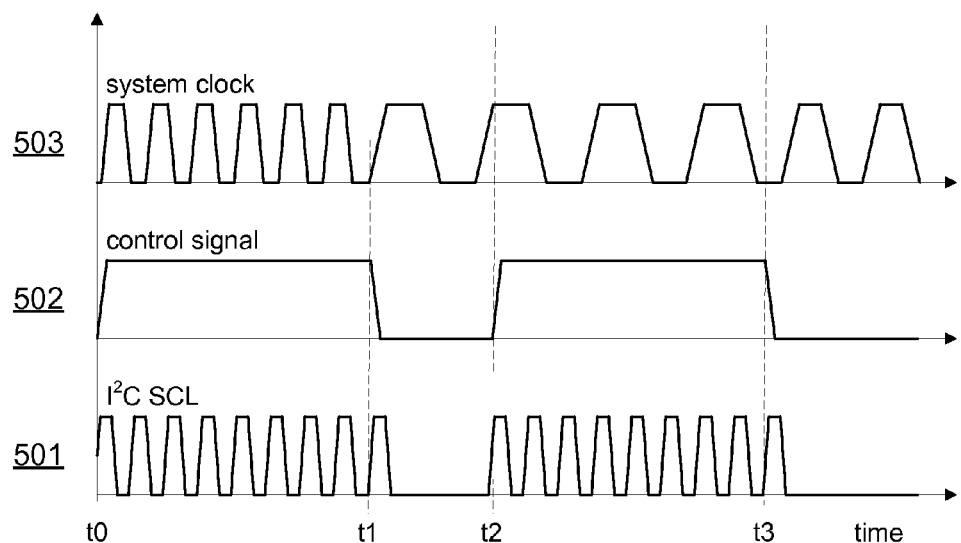
FIG. 5 illustrates a timing diagram for another embodiment of a clock calibration system.

Turning now to FIG. 5, another timing diagram for an embodiment of a clock calibration system is shown. Timing diagram 500 illustrates several waveforms associated with an embodiment of a clock calibration system, such as, for example, clock calibration circuit 210a of BMC 202a in FIG. 2. Timing diagram 500 includes waveforms showing logic states versus time for three signals from FIG. 3. Waveform 501 corresponds to I²C SCL 314, waveform 502 corresponds to control signal 318, and waveform 503 corresponds to system clock 310.

In the present embodiment, a counting cycle of counter circuit 303 corresponds to a rising transition on control signal 502 to a falling transition, e.g., from time t0 to time t1. Control signal 502 is the output of frequency divider 305 and in this example a single high pulse of control signal 502 corresponds to eight cycles of I²C SCL 501 (in other words, I²C SCL 501 divided by sixteen). Counter circuit 303 is configured to count falling edges of system clock 503 in this embodiment.

Before time t0, system clock 503 is running at a frequency higher than a target frequency. To calibrate system clock 503, BMC 202a waits for communication from host 220 over an I²C interface. In the present embodiment, host clock 225 corresponds to I²C SCL 501. Frequency divider 305 is initialized such that a next rising transition on I²C SCL 501 will cause a rising transition on control signal 502. At time t0, I²C SCL 501 begins transitioning high and control signal 502 responds by transitioning high, beginning a counting cycle. At time t1, eight cycles of I²C SCL 501 have been received and control signal 502 transitions low, ending the present counting cycle. Between times t0 and t1, six falling edges of system clock 503 may be counted. A value of four may be the expected count value.

After time t1, in response to the count value being higher than the expected value, control logic 309 adjusts internal clock source 301 to reduce the frequency of system clock 503. During this time, BMC 202a may use I²C interface 307 to stretch I²C SCL 501, thereby delaying the next rising edge. In a typical I²C operation, I²C SCL 501 is only active while data is being transmitted or received. To conserve cycles of I²C SCL 501 from host 220, I²C interface 307 stretches I²C SCL 501 by driving the signal line low. The corresponding I²C interface on host 220 detects the I²C SCL 501 line being held low and waits for the signal line to be released before resuming transmission of I²C SCL 501. Using the I²C clock stretching feature in this described manner may allow more cycles of I²C SCL 501 to be used for the clock calibration and may therefore result in more counting cycles resulting in a more accurate system clock 503.

At time t3, control logic 309 has completed the adjustment to internal clock source 301 and has reinitialized frequency divider 305. Control logic 309 enables I²C interface 307 to release I²C SCL 501. Host 220 resumes transmission of I²C SCL 501, resulting in another rising edge of control signal 502 and the beginning of a new counting cycle. The new counting cycle ends at time t3, at which point the count value is three falling edges of system clock 503. Since the count value is now less than the expected value, control logic again adjust internal clock source 301 to increase the frequency of system clock 503. I²C SCL 501 is again disabled using the clock stretching function of I²C interface 307. The process repeats until the frequency of system clock 503 reaches or until host 220 completes the I²C communication and disables I²C SCL 501.

Several methods may be used to abort a current counting cycle in case I²C SCL is disabled during an active counting cycle. For example, I²C interface may assert a signal upon reaching the end of a received I²C packet and control logic 309 may abort an active counting cycle in response. In another example, the counting cycle may be aborted if the count value reaches a predetermined value, such as an count overflow value. In some embodiments, counting cycles may be set to coincide with the transmission of one byte of data through I²C interface 307. Sending one byte of data via I²C interface 307 may include eight bits of data plus one or more start bits, stop bits, or parity bits, allowing a counting cycle to include ten or more cycles of I²C SCL 501. As long as host 220 sends I²C packets in whole bytes, then I²C SCL 501 should not be disabled during a counting cycle.

It is noted that timing diagram 500 of FIG. 5 is an example of possible waveforms in a clock calibration circuit and are simplified to provide clear descriptions of the disclosed concepts. In various embodiments, the relative frequencies of the three illustrated signals were chosen for ease of comprehension. In various embodiments, the frequencies of the system clock and/or the external clock may be much greater than the frequency of the control signal. The signals may appear different in other embodiments due various influences such as technology choices for building the circuits, actual circuit design and layout, ambient noise in the environment, choice of power supplies, etc.

Figure 6:
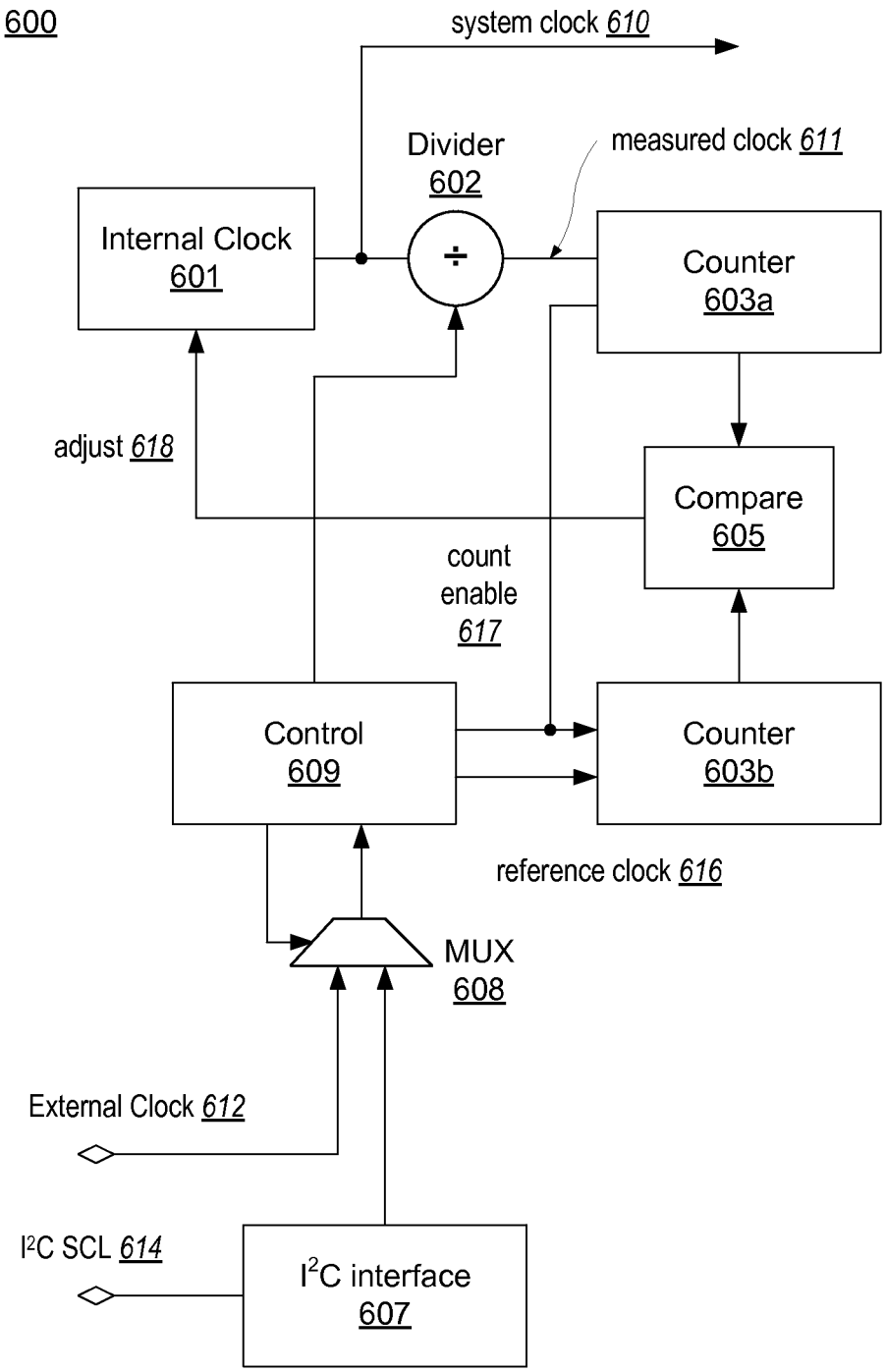
FIG. 6 shows a block diagram of another embodiment of a clock calibration circuit.

Referring now to FIG. 6, a block diagram of another embodiment of a clock calibration circuit is illustrated. Similar to clock calibration circuit 300, as illustrated in FIG. 3, clock calibration circuit 600 may correspond to each of clock calibration circuits 210a-c in FIG. 2 and, therefore, be a subsystem of a battery management circuit such as each of BMC 202a-c. Clock calibration circuit 600 includes internal clock generator 601 coupled to divider 602 and compare unit 605. Compare unit 605 is coupled to counters 603a and 603b as well as control logic 609. Multiplexor circuit (MUX) 608 is coupled to I²C interface 607 and control logic 609. Signals external clock 612 and I²C SCL 614 are received by clock calibration circuit 300 and system clock 610 is an output. Clock calibration circuit 600 also includes internal signals reference clock 616, count enable 617, adjustment signal 618, and measured clock 611.

Several functional blocks of clock calibration circuit 600 may, in various embodiments, correspond to similarly named blocks in clock calibration circuit 300 in FIG. 3. In the illustrated embodiment, for example, internal clock generator 601 corresponds to internal clock generator 301, I²C interface 607 corresponds to I²C interface 307, and MUX 608 corresponds to MUX 308. Descriptions provided above for these functional blocks remain valid for clock calibration circuit 600.

Upon powering on, internal clock generator 601 may oscillate at a predetermined frequency dependent on a default setting. System clock 610 is generated and provided as an input to divider 602 as well as to other circuits in the BMC. Divider 602 receives system clock 610 from internal clock generator 601 and divides the clock signal to create measured clock 611. A divisor value is selected by control logic 609 such that the frequency of measured clock 611 is close to the frequency of reference clock 616. Measured clock 611 is received by counter circuit 303a.

In the present embodiment, reference clock 616 is selected from external clock 612 and I²C SCL 614 (via I²C interface 607). In other embodiments, additional or different clock sources may be available as a source for reference clock 616. Control logic 609 sends a signal to MUX 608 to select either external clock 612 or I²C SCL 614 as the source for reference clock 616. For example, if a clock in BMC 202a is being calibrated, then I²C SCL 614 may be received from host 220 and used as the source for reference clock 616. In contrast, if a clock in BMC 202b or BMC 202c is being calibrated, then external clock 612 may be received from another BMC and used as the source for reference clock 616.

Control circuit 609 sends reference clock 616 to counter 603b. In other embodiments, counter 603b may be coupled to MUX 608 to receive reference clock 616. Control circuit 609 also generates count enable signal 617. Count enable signal 617 is sent to both counters 603a-b to be used as an enable signal to indicate when counters 603a-b start and stop counting. Counters 603a and 603b count cycles of measured clock 611 and reference clock 616, respectively. Counters 603a-b may, in various embodiments, begin counting in response to a rising or falling transition of count enable signal 617. Counters 603a-b may stop counting either in response to an opposite transition (e.g., rising transition to falling transition) or a subsequent transition in the same direction (e.g. rising transition to next rising transition) of count enable signal 617. The time period in which counters 603a-b are actively counting may be referred to as a counting cycle. During a counting cycle, counters 603a and 603b count cycles of measured clock 611 and reference clock 616 by incrementing a count value for each rising transition (or each falling transition in other embodiments) of the respective clock signal. In response to the end of a counting cycle, each counter 603 sends its respective count value to compare unit 605.

Compare unit 605 outputs adjustment signal 618 to internal clock generator 601. A value of adjustment signal 618 is dependent upon a comparison of the count values from counters 603a-b. If the count value for counter 603a is higher than the count value for counter 603b, then the frequency of measured clock 611 (and hence system clock 610) is too high and the value of adjustment signal 618 causes internal clock generator 601 to reduce the frequency of system clock 610. Likewise, if the count value for counter 603a is lower than the count value for counter 603b, then the frequency of measured clock 611 is too low and the value of adjustment signal 618 causes internal clock generator 601 to increase the frequency of system clock 610. If the two count values are equal, or in some embodiments, if the difference between the two count values is less than a predetermined value, then system clock 610 may be considered calibrated and the value of adjustment signal 618 indicates no change should be made in response to the just completed counting cycle.

In some embodiments, adjustment signal 618 may be a single signal that sends a serialized digital value to internal clock generator 601. The digital value received via adjustment signal 618 may indicate a direction and magnitude of a frequency change for system clock 610. In other embodiments, adjustment signal 618 may include two separate signals, asserted individually by compare unit 605, one to indicate an increment to the frequency of system clock 610 and the other to indicate a decrement to the frequency. In further embodiments, adjustment signal 618 may correspond to an analog signal in which a voltage level is used to indicate a frequency for system clock 610. For example, a higher voltage may result in a higher frequency and vice versa.

It is noted that clock calibration circuit 600 of FIG. 6 is merely an example embodiment of a clock calibration circuit. Only the components necessary to demonstrate the disclosed concepts are shown. In other embodiments, additional components may be included.

Figure 7:
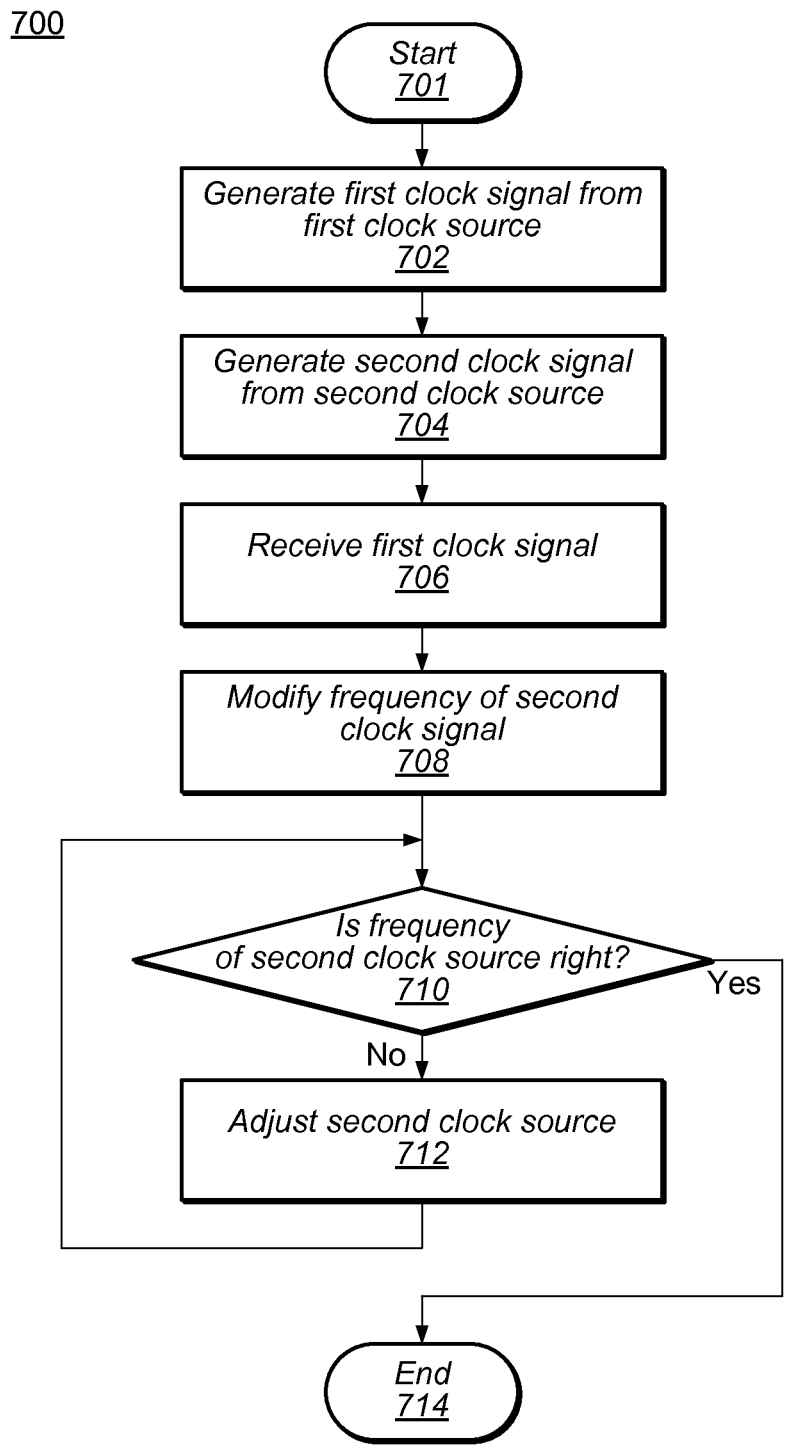
FIG. 7 shows a flow diagram illustrating an embodiment of a method for calibrating clock signals.

Moving to FIG. 7, a flow diagram illustrating an embodiment of a method for calibrating clock signals is shown. The method may be applied to a clock calibration circuit, such as illustrated in FIG. 6. Referring collectively to clock calibration circuit 600 of FIG. 6, system 200 of FIG. 200, and the flowchart in FIG. 7, the method begins in block 701.

A first clock signal is generated by a first clock source (block 702). Referring to FIG. 2, if a clock signal in BMC 202a is being calibrated, then the first clock signal may correspond to host clock 225 and is, therefore, generated in host 220. In various embodiments, host clock 225 may correspond to external clock 612 or I²C SCL 614. If a clock signal in BMC 202b is being calibrated, then the first clock signal may correspond to chip-to-chip comms clock 230ab and is generated in BMC 202a. In some embodiments, BMC 202a may repeat host clock 225 as chip-to-chip comms clock 230ab to allow BMC 202b to be calibrated in parallel with BMC 202a. Similarly, BMC 202b may repeat chip-to-chip comms clock 230ab as chip-to-chip comms clock 230bc to allow BMC 202c to also be calibrated in parallel.

A second clock signal is generated by a second clock source (block 704). The internal clock generator 601 within the BMC 202 being calibrated generates the second clock signal. Internal clock generator 601 may produce the second clock signal, system clock 610, with a frequency set by default settings or may resume with a frequency determined by a most recent setting.

The first clock signal is received by the BMC 202 being calibrated (block 706). The first clock signal is received as either external clock 612 or as I²C SCL 614, depending on the type of the first clock source. Referring to FIG. 2, if BMC 202b or BMC 202c is being calibrated, then the first clock signal is external clock 312 and may correspond to chip-to-chip comms clock 230ab or chip-to-chip comms clock 230bc, respectively. If BMC 202a is being calibrated, then the first clock source may be received from host 220 as either external clock 612 or as I²C SCL 614, depending on the type of clock signal being generated by host 220. If the clock signal corresponds to a serial clock line from an I²C interface, then the first clock source corresponds to I²C SCL 614 and control logic 609 selects this input as reference clock 616 using MUX 308. Otherwise, external clock 612 is used as reference clock 616.

The frequency of system clock 610 is modified (block 708). Dependent upon the frequency of system clock 610 and the frequency of reference clock 616, a suitable divisor value is set in frequency divider 602 to generate measured clock 611. A suitable divisor value may result in the frequency of measured clock 611 to be similar to the frequency of reference clock 616. The divisor value may be selected such that a synchronized system clock 610 results in a measured clock 611 with approximately the same frequency as reference clock 616.

Further operations of the method may depend on the frequency of the second clock signal (block 710). The frequency of measured clock 611 is compared to the frequency of reference clock 616. In the present embodiment, counter 603a is used to count a number of transitions of measured clock 611 over a period of time determined by count enable 617, referred to herein as a "counting cycle." During a same counting cycle, counter 603b is used to count a number of transitions of reference clock 616 over the same period of time. In various embodiments, counters 603a-b may count rising transitions, falling transitions, or both. Counters 603a-b may also, in various embodiments, count the transitions during a given high logic state, a given low logic state, or one or more cycles of count enable 617. At the end of a counting cycle, the count values of counters 603a-b are compared. Compare unit 605 determines if the value of counter 603a is greater then, less than, or equal to the value of counter 603b. If the count value of counter 603a from a most recent counting cycle does not match the value of counter 603b, then the method moves to block 712 to adjust system clock 610. Otherwise, if the count values do match, then the method ends in block 714.

The frequency of system clock 610 is adjusted dependent upon the comparison of the count values from the most recent counting cycle (block 712). If compare unit 605 determines that the most recent count values do not match, then compare unit 605 adjusts internal clock generator 601 to adjust the frequency of system clock 610 closer to the target frequency. In the illustrated embodiment, if the count value from counter 603a is higher than the count value from counter 603b, then the frequency of system clock 610 is too high and compare unit 605, accordingly, adjusts internal clock generator 601 to reduce the frequency by a suitable amount. Conversely, if the count value from counter 603a is lower than the count value from counter 603b, then compare unit 605 adjusts internal clock generator 601 to increase the frequency of system clock 610. The method then returns to block 710 to determine if the adjusted frequency of system clock 610 matches the target frequency or not.

It is noted that the method illustrated in FIG. 7 is merely an example embodiment. Variations on this method are possible and contemplated for example, some operations may be performed in a different sequence or in parallel. In other embodiments, additional operations may be included.

Figure 8:
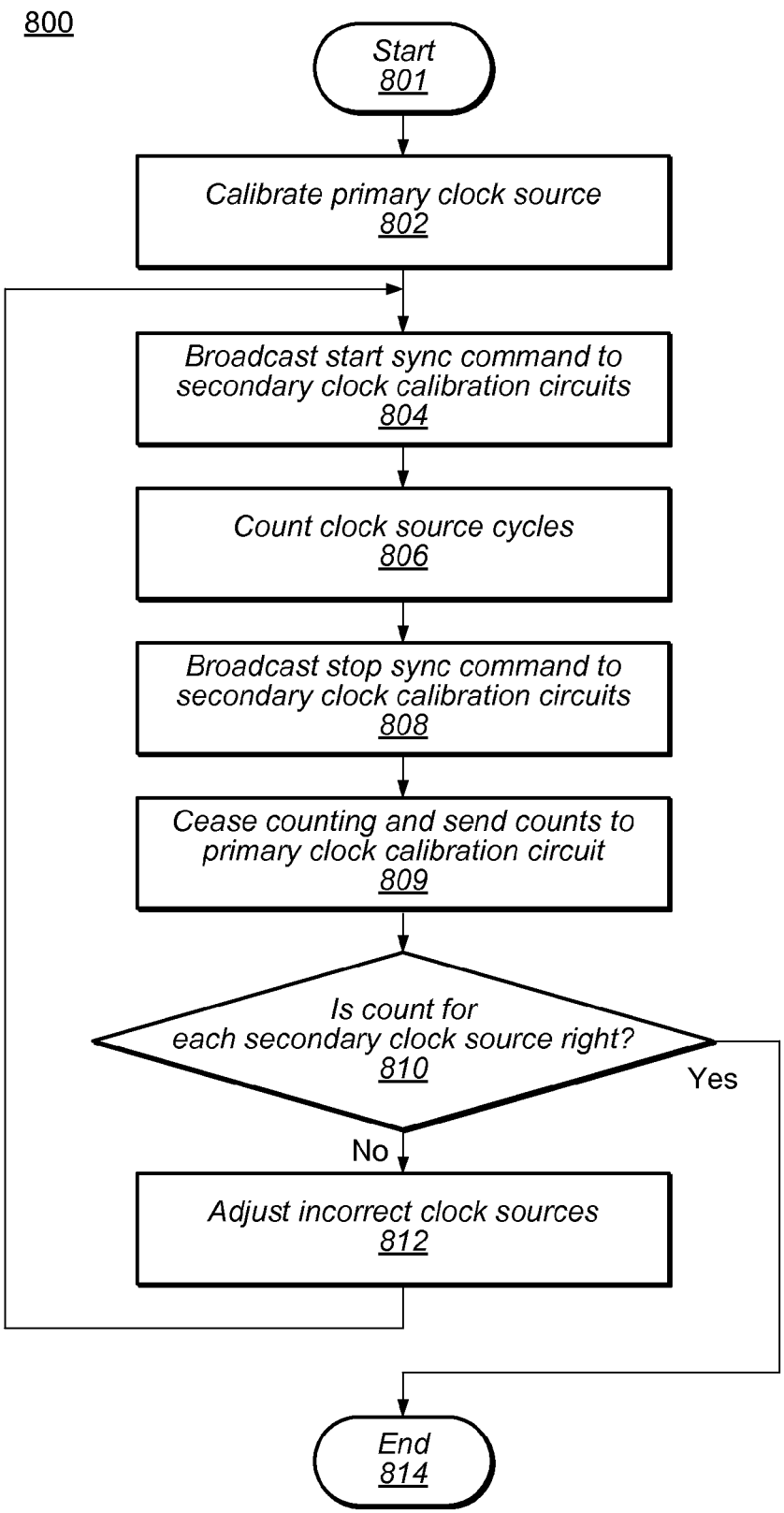
FIG. 8 illustrates a flow diagram illustrating an embodiment of a method for calibrating a plurality of clock signals in parallel.

Turning to FIG. 8, a flow diagram illustrating an embodiment of a method for calibrating a plurality of clock signals in parallel is shown. The method may be applied to a system such as illustrated in FIG. 2. For example, in system 200, a clock source in BMC 202a may be designated as a primary clock source and clock sources in BMCs 202b and 202c may be designated as secondary clock sources. Method 800 may be applied to use the primary clock source to calibrate the secondary clock sources in parallel. Referring collectively to system 200 of FIG. 2 and the flowchart in FIG. 8, the method begins in block 801.

The primary clock source is calibrated (block 802). The clock source for BMC 202a is calibrated prior to calibrating clock sources in BMC 202b or BMC 202c. The primary clock source in BMC 202a may be calibrated using method 700 in FIG. 7. Host clock 225, which may correspond to an I²C SCL clock, is used as a reference clock for the calibration.

BMC 202a broadcasts a start calibration command to BMC 202b and BMC 202c (block 804). As used herein, "broadcast" refers to sending a command to any functional block coupled to a communication bus on which the command is broadcast. In the present embodiment, to broadcast the start calibration command, BMC 202a sends the command on chip-to-chip comms data 235ab and the command is repeated by BMC 202b on chip-to-chip comms data 235bc.

In response to the start calibration command, each BMC 202 counts clock cycles of its respective system clock (block 806). BMC 202a may count cycles of its primary system clock to determine when to broadcast a stop calibration command while BMC 202b and BMC 202c count cycles of their respective secondary system clocks for the calibration operation.

BMC 202a broadcasts a stop calibration command to BMCs 202b-c (block 808). After BMC 202a counts a predetermined number of cycles of its primary system clock, BMC 202a broadcasts the stop calibration command via chip-to-chip comms data 235ab and chip-to-chip comms data 235bc. The time between BMC 202a broadcasting the calibration start and stop commands may be referred to as a counting cycle.

In response to the stop calibration command, BMCs 202b-c cease incrementing, and read their respective counters (block 809). BMC 202b and BMC 202c each send their respective count values to BMC 202a. The respective count values may be sent serially, such as, for example, by sending the count value from BMC 202b first and then sending the count value for BMC 202c.

Further operations of the method may depend on the count values received by BMC 202a (block 810). BMC 202a receives the respective count values and compares each value to the predetermined number of cycles. In the present embodiment, a received count value that matches the predetermined number indicates the respective secondary clock source is calibrated. A received count value that is higher than the predetermined number indicates a frequency of the respective secondary clock source is too high. Similarly, a received count value that is lower than the predetermined number indicates a frequency of the respective secondary clock source is too low. If all of the received count values match (or in other embodiments, are within a suitable range of) the predetermined number, the method ends in block 814. Otherwise, if at least one received count value is not calibrated, the method moves to block 812 to adjust a corresponding clock source.

One or more secondary clock sources receive adjustment indicators (block 812). BMC 202a sends an adjustment value to any secondary BMC 202 with a corresponding clock source that has not completed calibration to an acceptable frequency. For example, if the count value from BMC 202b is 90, the count value from BMC 202c is 115, and the predetermined number is 100, then BMC 202a may send an adjustment value to BMC 202b indicating its system clock frequency is to be increased and an adjustment value to BMC 202c indicating its system clock frequency is to be decreased. If a count value matches the predetermined number, then BMC 202a may send an adjustment value indicating no change is to be made to the respective clock source or, in other embodiments, may not send an adjustment value to any BMC with a suitably calibrated clock. The method returns to block 804 to perform another counting cycle.

It is noted that the method illustrated in FIG. 8 is merely an example embodiment. Variations on this method are contemplated. For example, some operations may be performed in a different sequence or in parallel. In other embodiments, some operations may be excluded or additional operations may be included.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system comprising:
a plurality of devices, wherein each device of the plurality of devices has a respective clock source;
wherein a first device of the plurality of devices is configured to generate a first clock signal;
wherein a second device of the plurality of devices is configured to:
generate a second clock signal;
receive the first clock signal from the first device;
modify a first frequency of the first clock signal; and
adjust a second frequency of the second clock signal dependent upon the modified first frequency of the first clock signal.

2. The system of claim 1, wherein the first device is further configured to use a clock output of an inter-integrated circuit (I²C) interface to generate the first clock signal.

3. The system of claim 2, wherein to modify the first frequency of the first clock signal, the second device is further configured to stretch the first clock signal.

4. The system of claim 1, wherein the second device is further configured to generate a third clock signal with the first frequency and send the third clock signal to a third device of the plurality of devices.

5. The system of claim 4, wherein the third device is configured to:
generate a fourth clock signal;
receive the third clock signal from the second device;
modify the first frequency of the third clock signal; and
adjust a fourth frequency of the fourth clock signal dependent upon the modified first frequency of the third clock signal.

6. The system of claim 1, wherein to generate the first clock signal, the first device includes a crystal oscillator.

7. The system of claim 1, wherein a respective supply voltage terminal of the first device is coupled to a positive terminal of a first power supply, and wherein a respective common mode voltage terminal of the second device is coupled to the positive terminal of the first power supply.

8. A method, comprising:
generating, by a first circuit, a first clock signal;
generating, by a second circuit, a second clock signal;
receiving, by the second circuit, the first clock signal from the first circuit;
modifying, by the second circuit, a first frequency of the first clock signal; and
adjusting, by the second circuit, a second frequency of the second clock signal dependent upon the modified frequency of the first clock signal.

9. The method of claim 8, wherein the first circuit includes a clock output of an inter-integrated circuit (I²C) interface.

10. The method of claim 9, wherein modifying the first frequency of the first clock signal further comprises stretching, by the second circuit, the first clock signal.

11. The method of claim 8, further comprising sending, by the second circuit, the second clock signal to a third circuit.

12. The method of claim 11, further comprising:
generating, by the third circuit, a third clock signal;
receiving, by the third circuit, the second clock signal from the second circuit;
modifying, by the third circuit, the second frequency of the second clock signal; and
adjusting, by the third circuit, a third frequency of the third clock signal dependent upon the modified second frequency of the second clock signal.

13. The method of claim 8, wherein generating the first clock signal comprises using a crystal oscillator.

14. The method of claim 8, further comprising:
supplying a voltage level at a power supply terminal of the first circuit; and
supplying the voltage level at a common mode terminal of the second circuit.

15. An apparatus, comprising:
an input circuit configured to receive a first clock signal;
a logic circuit configured to modify a frequency of the first clock signal; and
a clock circuit configured to generate a second clock signal dependent upon the modified frequency of the first clock signal.

16. The apparatus of claim 15, wherein the input circuit is further configured to receive the first clock signal via an inter-integrated circuit (I²C) interface.

17. The apparatus of claim 16, wherein to modify the frequency of the first clock signal, the logic circuit is further configured to stretch the first clock signal.

18. The apparatus of claim 17, wherein the logic circuit is further configured to broadcast a command to at least one other device in response to receiving the first clock signal via the I²C interface.

19. The apparatus of claim 18, wherein the command is broadcast via a second interface, wherein the second interface is different than the I²C interface.

20. The apparatus of claim 15, wherein to generate the second clock signal dependent upon the modified frequency of the first clock signal, the clock circuit is further configured to use a counter circuit.

* * * * *